United States Patent
Leng

(10) Patent No.: US 11,133,432 B2
(45) Date of Patent: Sep. 28, 2021

(54) DISPLAY PANEL AND MANUFACTURING METHOD THEREOF, AND DISPLAY DEVICE

(71) Applicant: Shanghai Tianma Micro-Electronics Co., Ltd., Shanghai (CN)

(72) Inventor: Chuanli Leng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 25 days.

(21) Appl. No.: 16/702,826

(22) Filed: Dec. 4, 2019

(65) Prior Publication Data
US 2020/0321488 A1 Oct. 8, 2020

(30) Foreign Application Priority Data
Apr. 3, 2019 (CN) .......................... 201910267633.1

(51) Int. Cl.
| | | |
|---|---|---|
| *H01L 23/04* | (2006.01) | |
| *H01L 21/44* | (2006.01) | |
| *H01L 33/00* | (2010.01) | |
| *G06F 3/041* | (2006.01) | |
| *G06F 1/16* | (2006.01) | |
| *H01L 25/075* | (2006.01) | |

(Continued)

(52) U.S. Cl.
CPC ........ *H01L 33/0095* (2013.01); *G06F 1/1652* (2013.01); *G06F 3/04144* (2019.05); *H01L 25/0753* (2013.01); *H01L 33/52* (2013.01); *H01L 33/62* (2013.01); *H01L 2933/005* (2013.01); *H01L 2933/0066* (2013.01)

(58) Field of Classification Search
CPC ...................................................... H01L 33/62

USPC .......... 438/666–668; 257/621, 698, 773–776
See application file for complete search history.

(56) References Cited

U.S. PATENT DOCUMENTS

| | | | | |
|---|---|---|---|---|
| 6,691,409 | B2* | 2/2004 | Suzuki | H05K 1/0373 |
| | | | | 29/825 |
| 7,091,589 | B2* | 8/2006 | Mori | H01L 23/49822 |
| | | | | 257/686 |
| 9,736,927 | B2* | 8/2017 | Cho | H05K 1/0271 |

(Continued)

FOREIGN PATENT DOCUMENTS

| | | |
|---|---|---|
| CN | 106409796 A | 2/2017 |
| CN | 106847864 A | 6/2017 |

(Continued)

*Primary Examiner* — Calvin Lee
(74) *Attorney, Agent, or Firm* — Anova Law Group, PLLC

(57) ABSTRACT

The present disclosure provides a display panel, a manufacturing method thereof, and a display device. The method includes: providing a first substrate; forming first via holes into a first surface; forming a first metal layer on the first surface and in the first via holes; patterning the first metal layer to form first portions, including first sub-portions in the first via holes; forming second via holes into a second surface; forming a second metal layer on the second surface and in the second via holes; patterning the second metal layer to form second portions and pads, that the second portions and the pads are electrically connected, the second portions includes second sub-portions in the second via holes, and the first sub-portions and the second sub-portions are electrically connected; and bonding and electrically connecting electronic components with the plurality of pads.

20 Claims, 15 Drawing Sheets

(51) Int. Cl.
*H01L 33/52* (2010.01)
*H01L 33/62* (2010.01)

(56) References Cited

U.S. PATENT DOCUMENTS 9,761,514 B2 * 9/2017 Ma .......................... H05K 3/42
10,622,310 B2 * 4/2020 Yang ................... H01L 23/5384
10,765,011 B2 * 9/2020 Chujo ................. C23C 16/0245

FOREIGN PATENT DOCUMENTS

| CN | 106910985 A | 6/2017 |
| CN | 107340916 A | 11/2017 |

* cited by examiner

DISPLAY PANEL AND MANUFACTURING METHOD THEREOF, AND DISPLAY DEVICE

CROSS-REFERENCES TO RELATED APPLICATIONS

This application claims the priority of Chinese Patent Application No. CN201910267633.1, filed on Apr. 3, 2019, the entire contents of all of which are incorporated herein by reference.

FIELD OF THE DISCLOSURE

The present disclosure generally relates to the field of display technologies and, in particular, relates to a display panel, a manufacturing method thereof, and a display device.

BACKGROUND

In recent years, display technologies have developed rapidly. To meet diversified needs of consumption, today's display technologies are moving fast in a direction toward narrow framed, high contrast, high resolution, full color display, low power consumption, high reliability, long life, thin, and light.

Referring to FIG. 1, to achieve a narrow frame, a display panel can be bent. Alternatively, the display panel includes a display area 01 and a peripheral non-display area 02. The non-display area 02 includes a pad area 03 for bonding an Integrated Circuit (IC) or a Flexible Printed Circuit (FPC). A bending zone F is disposed between the display area and the pad area, and the display panel in the bending zone F is bent toward a side facing away from a light-emitting surface. The pad area 03 is bent to a side facing away from the light-emitting surface of the display panel, thereby reducing the visible area of the non-display area, and visually achieving the technical effect of the narrow frame.

Consequently, the display panel has an increased thickness, which is disadvantageous to the thinning of the display device. On the other hand, bending the display panel reduces reliability and affects display quality.

Therefore, there is a need to provide a thin, high-reliability, narrow framed display panel.

BRIEF SUMMARY OF THE DISCLOSURE

One aspect of the present disclosure provides a manufacturing method of a display panel, including: providing a first substrate, that the first substrate includes a first surface and a second surface disposed opposite to the first surface; forming a plurality of first via holes into the first surface, that a depth of each of the first via hole is smaller than a thickness of the first substrate; forming a first metal layer on the first surface and in the plurality of first via holes; patterning the first metal layer to form a plurality of first portions, that the plurality of first portions includes first sub-portions in the plurality of first via holes; forming a plurality of second via holes into the second surface; forming a second metal layer on the second surface and in the plurality of second via holes; patterning the second metal layer to form a plurality of second portions and a plurality of pads, that the plurality of second portions and the plurality of pads are electrically connected, the plurality of second portions includes second sub-portions in the plurality of second via holes, and the first sub-portions and the second sub-portions are electrically connected; and bonding and electrically connecting electronic components with the plurality of pads.

Another aspect of the present disclosure provides a display panel, including: a first substrate, that the first substrate includes a first surface and a second surface disposed opposite to the first surface, that the first surface is provided with a plurality of first via holes, and a depth of each of the plurality of first via holes is smaller than a thickness of the first substrate, and the second surface is provided with a plurality of second via holes; a first metal layer, that the first metal layer includes a plurality of first portions, the plurality of first portions is located in the first surface, and the plurality of first portions includes first sub-portions in the plurality of first via holes; a second metal layer, that the second metal layer includes a plurality of second portions and a plurality of pads, the plurality of second portions and the plurality of pads are electrically connected, the plurality of second portions is located in the second surface, the plurality of second portions includes second sub-portions in the plurality of second via holes, and the first sub-portions and the second sub-portions are electrically connected; and electronic components, that the electronic components and the plurality of pads are bonded and electrically connected.

Another aspect of the present disclosure provides a display device, including the display panel provided by the present disclosure.

Other aspects of the present disclosure can be understood by those skilled in the art in light of the description, the claims, and the drawings of the present disclosure. Further features of the present disclosure and its advantages will become apparent from the following detailed description of exemplary embodiments.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
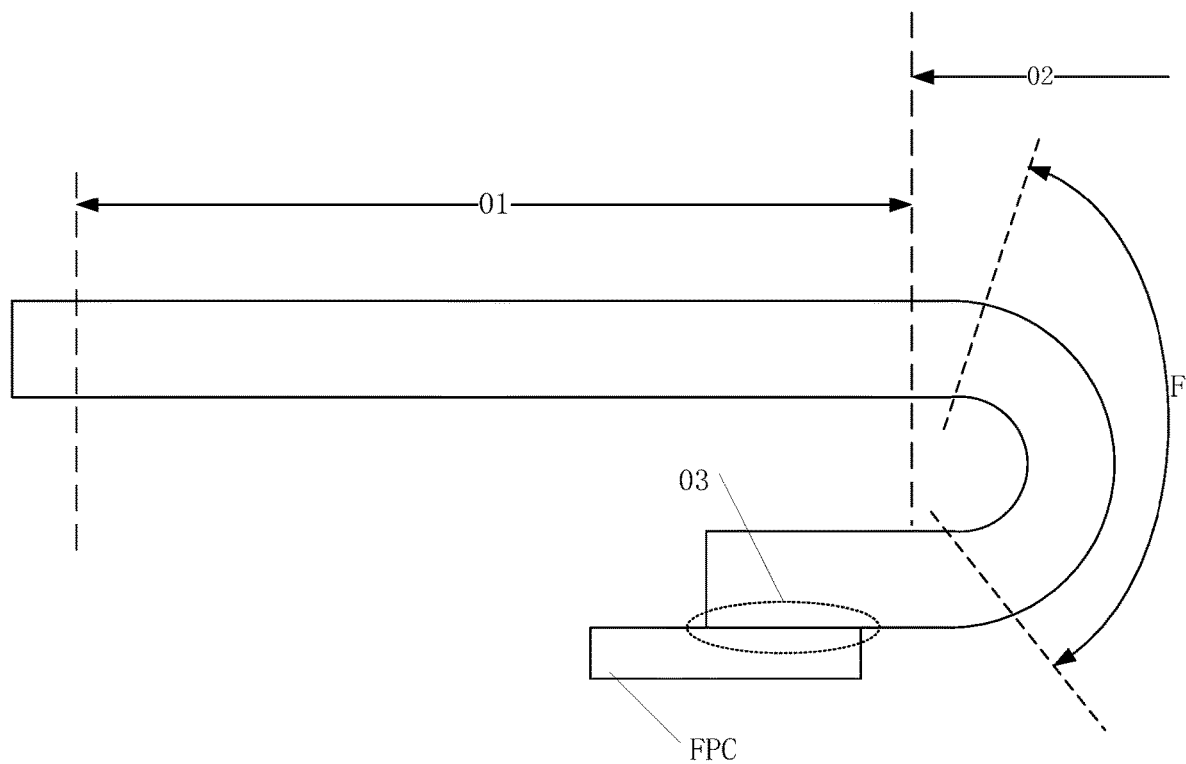
FIG. 1 is a schematic structural view of a display panel.

Various exemplary embodiments of the present disclosure are described in detail with reference to the drawings. The relative arrangement of the components and steps, numerical expressions, and numerical values set forth in the exemplary embodiments are not intended to limit the scope of the present disclosure unless otherwise specified.

The following description of at least one exemplary embodiment is merely illustrative, and never in any way limits the present disclosure and its application or use.

Techniques, methods, and apparatus known to those skilled in the art may not be discussed in detail, but the techniques, the methods, and the apparatus should be considered as part of the present disclosure, where appropriate.

In all of the examples shown and discussed herein, any specific values are to be construed as illustrative only and not as a limitation. Thus, other examples of the exemplary embodiments may have different values.

Similar reference numerals and letters indicate similar items in the following drawings, and therefore, once an item is defined in one drawing, it is not required to be further discussed in the subsequent drawings.

Figure 2:
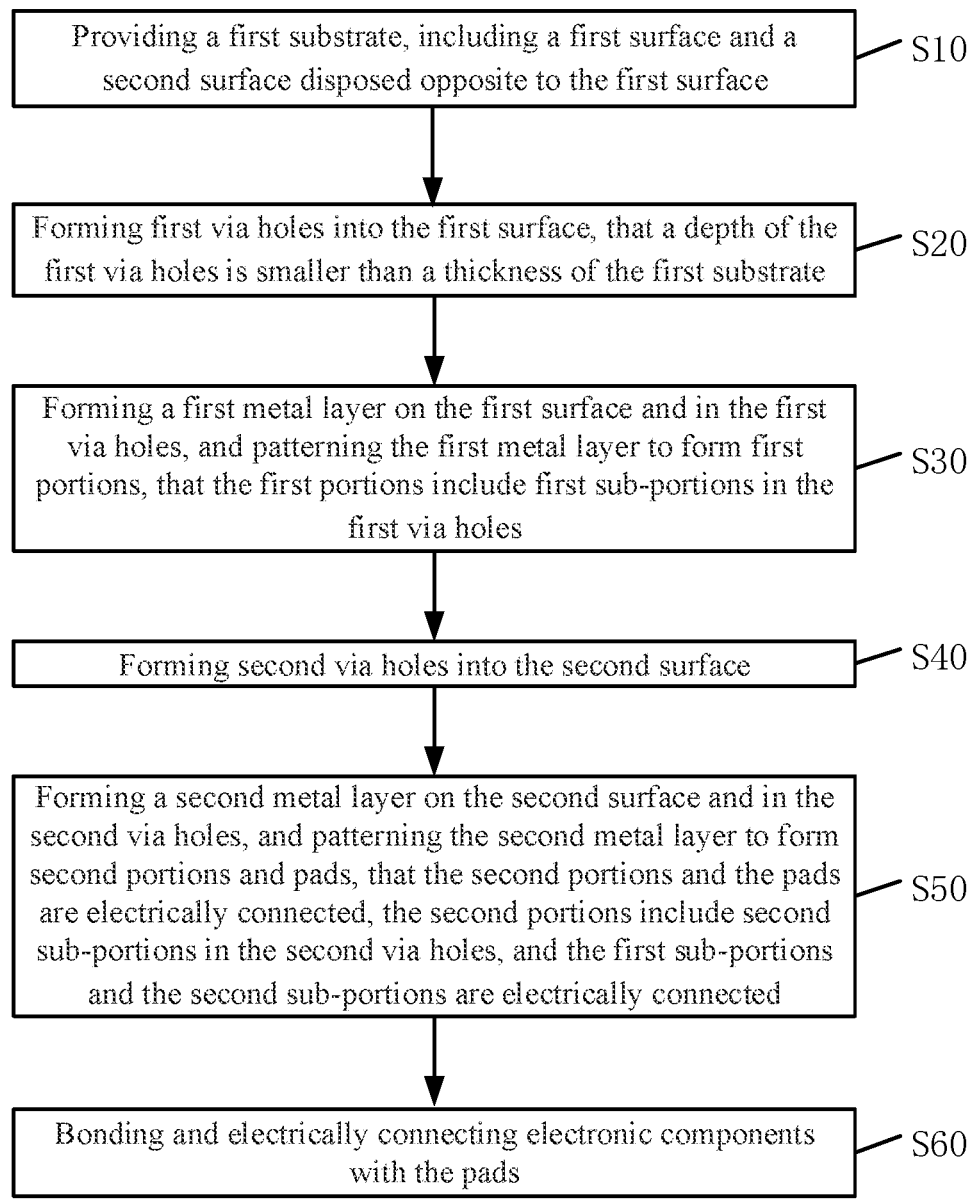
FIG. 2 is a flowchart of a manufacturing method of a display panel according to one embodiment of the present disclosure.
Figure 3:
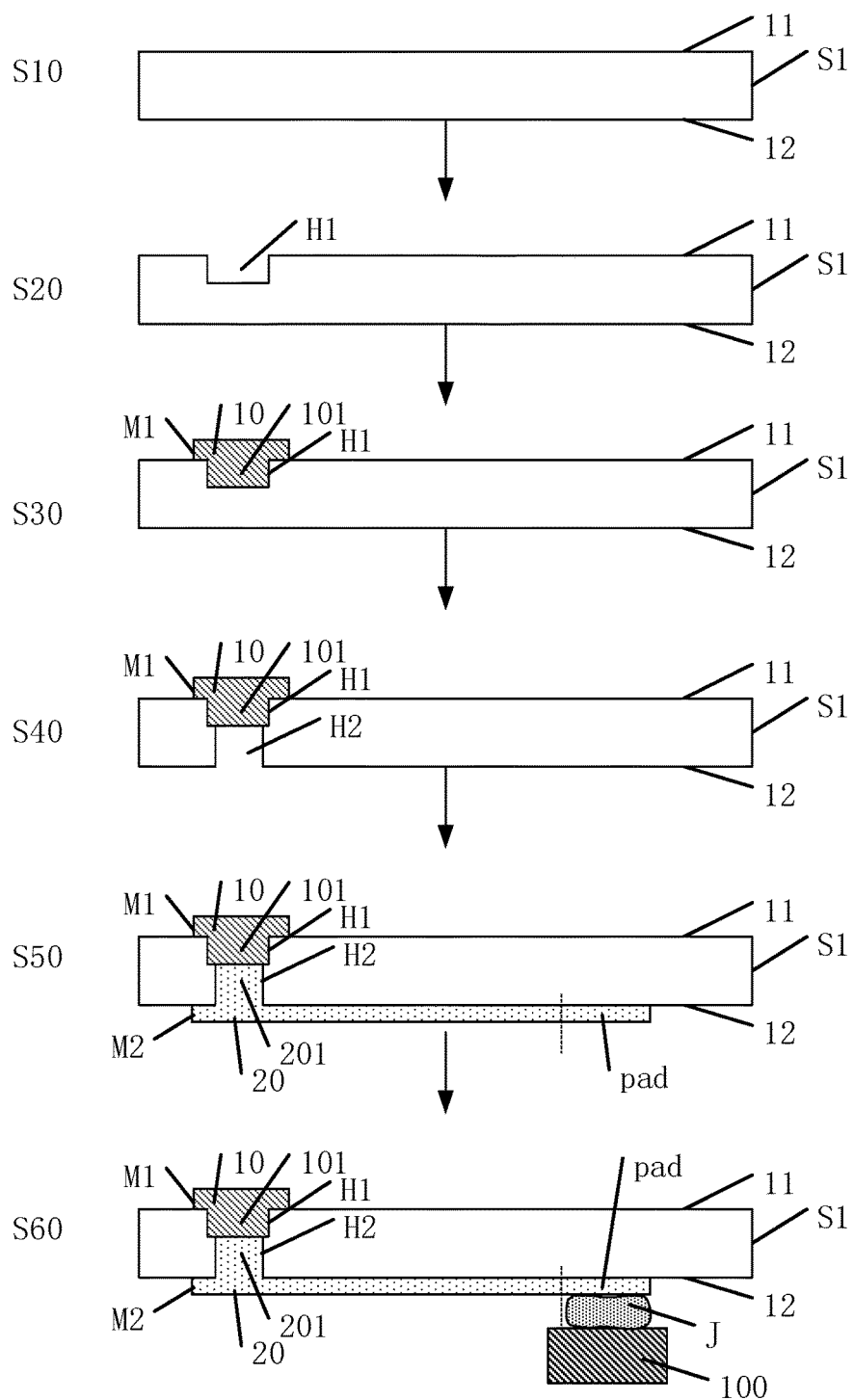
FIG. 3 is a schematic structural view of a display panel corresponding to the manufacturing method illustrated in FIG. 2.

Referring to FIG. 2 and FIG. 3, FIG. 2 is a flowchart of a manufacturing method of a display panel according to one embodiment of the present disclosure, and FIG. 3 is a schematic structural view of a display panel corresponding to the manufacturing method illustrated in FIG. 2.

One embodiment provides a manufacturing method of a display panel, including:

S10: providing a first substrate S1, that the first substrate S1 includes a first surface 11 and a second surface 12 disposed opposite to the first surface 11;

S20: forming a plurality of first via holes H1 into the first surface 11, that a depth of each of the plurality of first via holes H1 is smaller than a thickness of the first substrate S1;

S30: forming a first metal layer M1 on the first surface 11 and in the plurality of first via holes H1, and patterning the first metal layer M1 to form a plurality of first portions 10, that the plurality of first portions 10 includes first sub-portions 101 in the plurality of first via holes H1;

S40: forming a plurality of second via holes H2 into the second surface 12;

S50: forming a second metal layer M2 on the second surface 12 and in the plurality of second via holes H2, and patterning the second metal layer M2 to form a plurality of second portions 20 and a plurality of pads, that the plurality of second portions 20 and the plurality of pads are electrically connected, the plurality of second portions 20 includes second sub-portions 201 in the plurality of second via holes H2, and the first sub-portions 101 and the second sub-portions 201 are electrically connected; and S60: bonding and electrically connecting electronic components 100 with the plurality of pads.

The manufacturing method provided in one embodiment is used to manufacture a narrow framed display panel.

Alternatively, in S10, the first substrate S1 is provided, and the first substrate may be a flexible substrate, for example, made of a resin material. The material of the first substrate is not specifically limited in one embodiment.

The first substrate S1 has the first surface 11 and the second surface 12 disposed opposite to the first surface 11. Optionally, a film layer having a display function is formed on the first surface 11 side, and the second surface 12 is a back surface of the display panel and does not have a display function.

In S20, the plurality of first via holes H1 is formed, and the plurality of first via holes H1 extends from the first surface 11 toward the second surface 12. The plurality of first via holes H1 does not pass through the first substrate S1, that is, the depth of each of the plurality of first via holes H1 is smaller than the thickness of the first substrate S1.

In S30, the first metal layer M1 is deposited on the first surface 11 side of the first substrate, and the first metal layer M1 is naturally deposited into the plurality of first via holes H1. The first metal layer M1 is then patterned to form the plurality of first portions 10, and the plurality of first portions 10 includes the first sub-portions 101 in the plurality of first via holes H1. The plurality of first portions 10 may be signal lines or part of signal lines, or may be other circuit components, which is not specifically limited in one embodiment.

In S40, the plurality of second via holes H2 is formed, and the plurality of second via holes H2 extends from the second surface 12 toward the first surface 11. Optionally, the plurality of second via holes H2 and the plurality of first via holes H1 are in one-to-one correspondence, and the plurality of second via holes H2 and the corresponding plurality of first via holes H1 are connected.

In S50, the second metal layer M2 is deposited on the second surface 12 of the first substrate, and the second metal layer M2 is naturally deposited into the plurality of second via holes H2. The second metal layer M2 is then patterned to form the plurality of second portions 20 and the plurality of pads, and the plurality of second portions 20 includes the second sub-portions 201 in the plurality of second via holes H2. The first sub-portions 101 and the second sub-portions 201 are electrically connected, in other words, the plurality of first portions 10 and the plurality of second portions 20 are electrically connected.

In a process of depositing the second metal layer M2 on the second surface 12 of the first substrate, optionally, in other embodiments of the present disclosure, the second surface 12 of the first substrate may face upward (that is, facing a side facing away from the ground).

The plurality of second portions 20 serves as a connection for electrically connecting the plurality of first portions 10 with the plurality of pads. The plurality of first portions 10 is electrically connected to the plurality of second portions 20 through the plurality of first via holes H1 and the plurality of second via holes H2. The plurality of first portions 10 and the plurality of second portions 20 are in a parallel structure, and an equivalent resistance of the plurality of first portions 10 and the plurality of second portions 20 in parallel is smaller than a resistance of the plurality of first portions 10. The plurality of pads transmits an electrical signal to the plurality of first portions 10 through the plurality of second portions 20, which helps reduce a loss of electrical signals, thereby facilitating improvement of signal accuracy of the plurality of first portions 10, and improving display quality of the display panel.

The plurality of second portions 20 may be signal lines or other circuit components, which is not specifically limited in one embodiment. Optionally, the plurality of second portions 20 and the plurality of pads may be integrally formed. A shape and size of the plurality of second portions 20 are not specifically limited in one embodiment.

The plurality of second portions 20 is electrically connected to the plurality of pads, and the plurality of pads is used to bond the electronic components 100. In S60, the electronic components 100 and the plurality of pads are bonded and electrically connected. The electronic components 100 can transmit an electrical signal to the plurality of second portions 20 through the plurality of pads.

Optionally, the electronic components 100 are chips or flexible circuit boards, which is not specifically limited in one embodiment. Optionally, the electronic components 100 are bonded and electrically connected to the plurality of pads through conductive glue J.

The manufacturing method provided in one embodiment may further include manufacturing a display unit, a driving circuit, and the like, of the display panel, and the display unit, the driving circuit, and the like, are formed on the first surface 11 side. It is not specifically limited in one embodiment.

In the manufacturing method provided by embodiments of the present disclosure, the number of the plurality of first portions 10, the number of the plurality of second portions 20, and the number of the plurality of pads are plural, and the plurality refers to three or more. The number of the plurality of first portions 10, the number of the plurality of second portions 20, and the number of the plurality of pads, are not specifically limited in the embodiments of present disclosure, and may be specifically designed and fabricated according to an actual situation of a display panel. However, to clearly illustrate the technical solutions of the embodiments of the present disclosure, in the drawings of the present disclosure, the number of the plurality of first portions 10, the number of the plurality of second portions 20, and the number of the plurality of pads, is one respectively, only as an example, to exemplify a position structure and electrical connection relationships.

The display panel manufactured by the manufacturing method provided in one embodiment can realize transmission of electrical signals of conductive structures on opposite sides of the first substrate S1. Alternatively, the plurality of first via holes H1 is formed into the first surface 11 of the first substrate S1, then the plurality of first portions 10 is formed, and the plurality of first portions 10 includes the first sub-portions 101 in the plurality of first via holes H1. The plurality of second via holes H2 is formed into the second surface 12 of the first substrate S1, then the plurality of second portions 20 and the plurality of pads are formed, and the plurality of second portions 20 includes the second sub-portions 201 in the plurality of second via holes H2. The first sub-portions 101 and the second sub-portions 201 are electrically connected, that is, the plurality of first portions 10 and the plurality of second portions 20 are electrically connected. The plurality of pads and the plurality of second portions 20 are electrically connected, and the plurality of pads is used for bonding the electronic components 100. Thereby, an electrical signal of the plurality of first portions 10 is transmitted to the electronic components 100 through the plurality of second portions 20 and the plurality of pads. The first surface 11 side may be a front side of the display panel, that is, a side of a display screen, and the second surface 12 side may be a back side of the display panel. The electronic components 100 are bonded to the second surface 12 side of the display panel, which helps reduce an area of a non-display area and achieve technical effect of a narrow frame. Unlike conventional bent display panels, the disclosed display panel is beneficial to improving reliability and improving user experience. At the same time, the plurality of first portions 10 and the plurality of second portions 20 are electrically connected through the second sub-portions 201 and the first sub-portions 101 to ensure a signal transmission channel. The first sub-portions 101 and the second sub-portions 201 are formed respectively through the plurality of first via holes H1 and the plurality of second via holes H2, to improve uniformity of filling via holes of the first sub-portions 101 and the second sub-portions 201, thereby avoiding a risk of disconnection in the plurality of first via holes H1 and the plurality of second via holes H2, and ensuring stability of signal transmission. Moreover, the plurality of first portions 10 and the plurality of second portions 20 are in a parallel structure, and the equivalent resistance of the plurality of first portions 10 and the plurality of second portions 20 in parallel is smaller than the resistance of the plurality of first portions 10. The plurality of pads transmits the electrical signal to the plurality of first portions 10 through the plurality of second portions 20, which helps reduce the loss of the electrical signal, thereby improving the signal accuracy of the plurality of first portions 10 and improving the display quality of the display panel.

In some alternative embodiments, with continued reference to FIGS. 2 and 3, forming the plurality of second via holes H2 into the second surface 12 includes: connecting the plurality of second via holes H2 with the plurality of first via holes H1 to form through holes.

In one embodiment, the plurality of second via holes H2 is disposed in one-to-one correspondence with the plurality of first via holes H1, and the plurality of second via holes H2 and the corresponding plurality of first via holes H1 are connected. In other words, an orthographic projection of each of the plurality of second via holes H2 on the first surface 11 and an orthographic projection of each of the plurality of first via holes of H1 on the first surface 11 at least partially (e.g., wholly) overlap each other. Correspondingly, the first sub-portions 101 and the second sub-portions 201 are in direct contact to achieve an electrical connection. The orthographic projection of each of the plurality of first via holes on the first surface at least partially (e.g., wholly) overlaps the orthographic projection of each of the plurality of second via holes on the first surface, thereby ensuring performance stability of the electrical connection between the first sub-portions and the second sub-portions, and reducing difficulties on the production process.

In one embodiment, by forming the through holes by connecting the plurality of second via holes H2 with the plurality of first via holes H1, the first sub-portions 101 and the second sub-portions 201 are in direct contact to realize the electrical connection, and the structure is simple and easy to implement.

Figure 4:
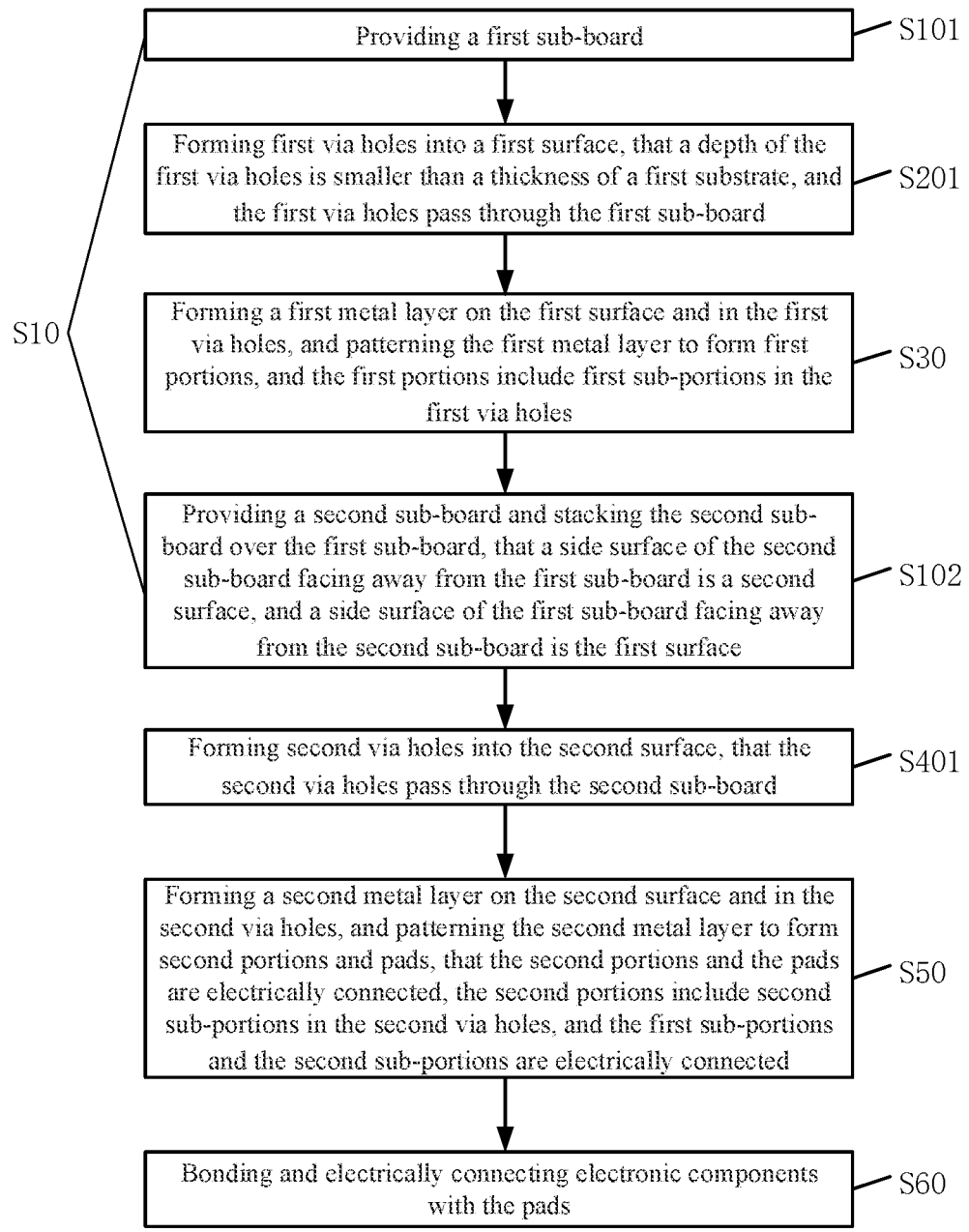
FIG. 4 is a flowchart of another manufacturing method of a display panel according to one embodiment of the present disclosure.
Figure 5:
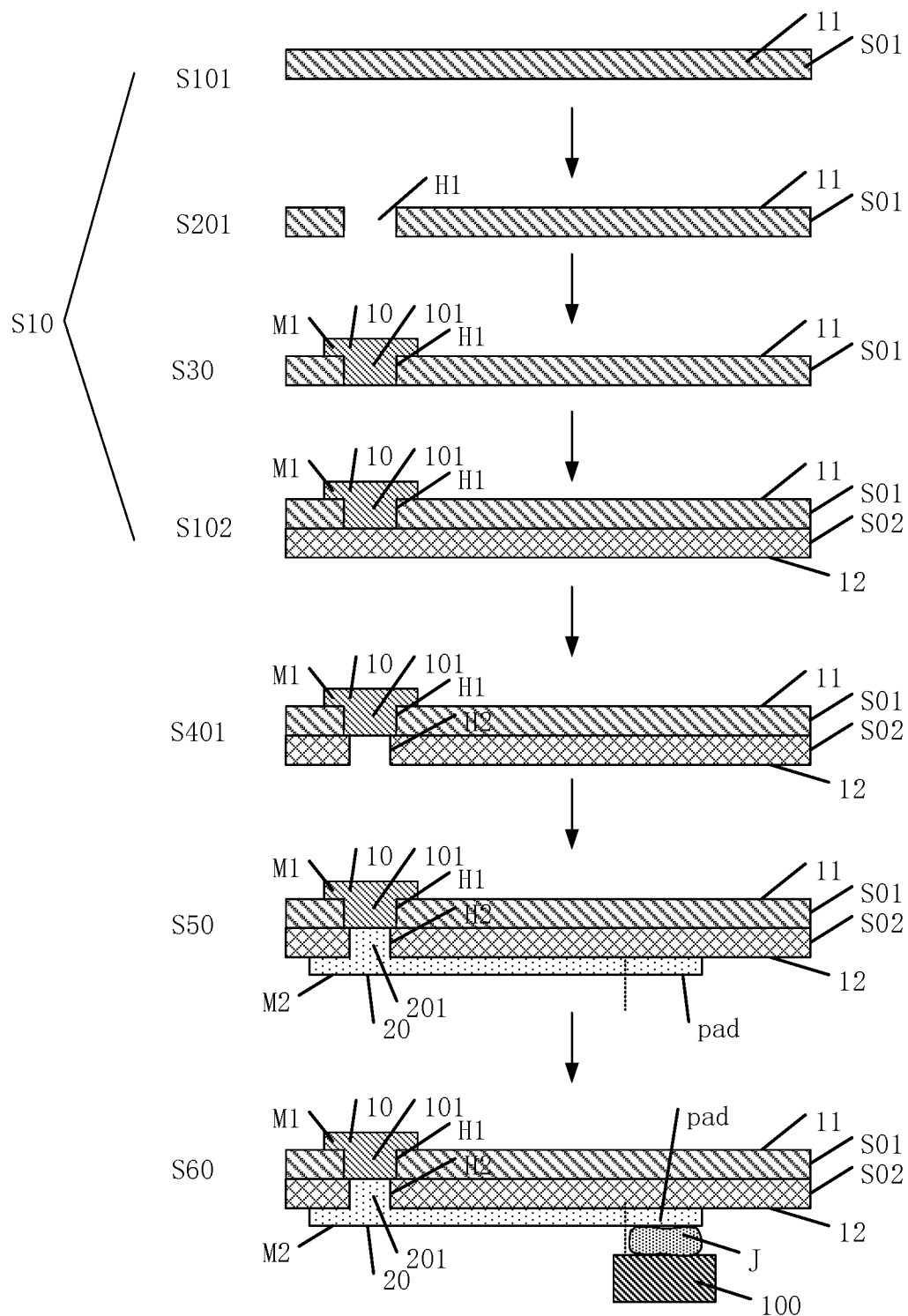
FIG. 5 is a schematic structural view of a display panel corresponding to the manufacturing method illustrated in FIG. 4.

In some alternative embodiments, referring to FIG. 4 and FIG. 5, FIG. 4 is a flowchart of another manufacturing method of a display panel according to one embodiment of the present disclosure, and FIG. 5 is a schematic structural view of a display panel corresponding to the manufacturing method shown in FIG. 4.

Providing a first substrate S1 includes:

S101: providing a first sub-board S01; and

S102: providing a second sub-board S02 and stacking the second sub-board S02 over the first sub-board S01, that a side surface of the second sub-board S02 facing away from the first sub-board S01 is a second surface 12, and a side surface of the first sub-board S01 facing away from the second sub-board S02 is a first surface 11.

Before S102: providing the second sub-board S02 and stacking the second sub-board S02 over the first sub-board S01, S201: forming a plurality of first via holes H1 into the first surface 11 is performed, and the plurality of first via holes H1 passes through the first sub-board S01;

After S102: providing the second sub-board S02 and stacking the second sub-board S02 over the first sub-board S01, S401: forming a plurality of second via holes H2 into the second surface 12 is performed, and the plurality of second via holes H2 passes through the second sub-board S02.

Figure 6:
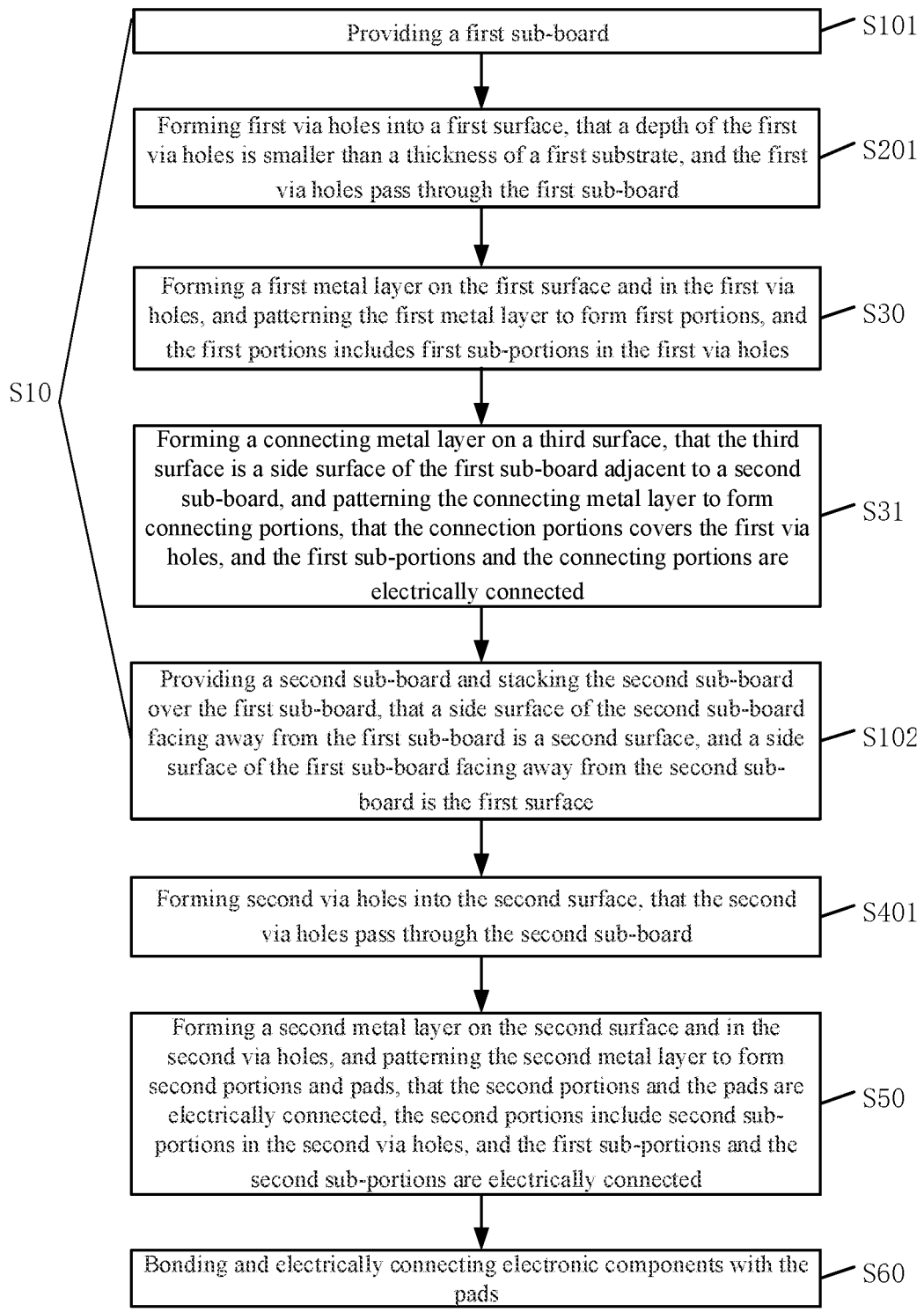
FIG. 6 is a flowchart of another manufacturing method of a display panel according to one embodiment of the present disclosure.
Figure 7:
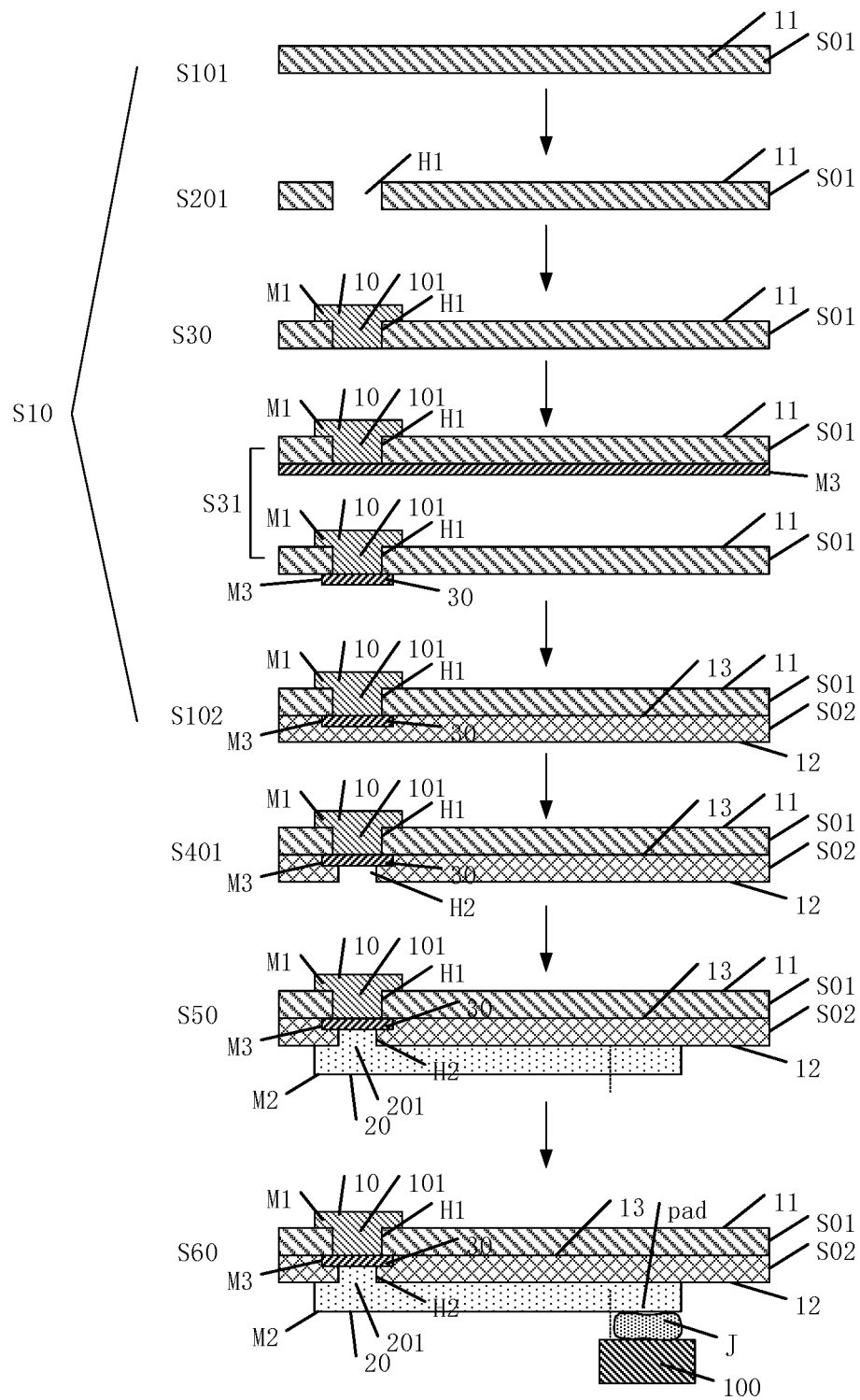
FIG. 7 is a schematic structural view of a display panel corresponding to the manufacturing method illustrated in FIG. 6.

In one embodiment, the first substrate S1 has a two-layer structure, including the first sub-board S01 and the second sub-board S02 stacked over. The plurality of first via holes H1 formed in S201 passes through the first sub-board S01, and the plurality of second via holes H2 formed in S401 passes through the second sub-board S02. The plurality of first via holes H1 and the plurality of second via holes H2 may be directly connected such that first sub-portions 101 and second sub-portions 201 are in direct contact to achieve an electrical connection. A thickness of the substrate of the two-layer structure is the same as a thickness of the substrate of a single-layer structure, and a thicknesses of the first sub-board S01 and the second sub-board S02 of the first substrate of the two-layer structure is smaller than the thickness of the first substrate of the single-layer structure. Optionally, the thickness of the first substrate S1 of the single-layer structure is about 15 µm, the thickness of the first sub-board S01 of the two-layer structure is about 5 µm, and the thickness of the second sub-board S02 of the two-layer structure is about 10 µm. In the foregoing S20, a plurality of first via holes H1 is formed in a first substrate S1, and the plurality of first via holes H1 does not pass through the first substrate S1. In one embodiment, the plurality of first via holes H1 passes through the first sub-board S01 in S201, and the plurality of second via holes H2 passes through the second sub-board S02 in S401. This embodiment avoids a problem of excessive etching of the first substrate of the single-layer structure when etching the plurality of first via holes H1, protects the display device, and also reduces difficulty of the etching process. Meanwhile, the plurality of first portions 10 and the plurality of second portions 20 are electrically connected through the second sub-portions 201 and the first sub-portions 101 to ensure a signal transmission channel. The first sub-portions 101 and the second sub-portions 201 are formed respectively through the plurality of first via holes H1 and the plurality of second via holes H2, to improve uniformity of filling via holes of the first sub-portions 101 and the second sub-portions 201, thereby avoiding a risk of disconnection in the plurality of first via holes H1 and the plurality of second via holes H2, and ensuring stability of signal transmission In some alternative embodiments, referring to FIG. 6 and FIG. 7, FIG. 6 is a flowchart of another manufacturing method of a display panel according to one embodiment of the present disclosure, and FIG. 7 is a schematic structural view of a display panel corresponding to the manufacturing method shown in FIG. 6.

In one embodiment, after patterning a first metal layer M1 and before forming a plurality of second via holes H2 into a second surface 12, the method further includes:

S31: forming a connecting metal layer M3 on a third surface 13, that the third surface 13 is a side surface of a first sub-board S01 adjacent to a second sub-board S02; and patterning the connecting metal layer M3 to form a plurality of connecting portions 30, that the plurality of connection portions 30 covers a plurality of first via holes H1, and first sub-portions 101 and the plurality of connecting portions 30 are electrically connected.

Forming the plurality of second via holes H2 into the second surface 12 includes: S402: electrically connecting the plurality of second via holes H2 with the plurality of connecting portions 30.

In the manufacturing method provided in one embodiment, the connecting metal layer M3 is further disposed between the first sub-board S01 and the second sub-board S02, and the connecting metal layer M3 is patterned to form the plurality of connecting portions 30. Optionally, the plurality of connecting portions 30 is disposed in one-to-one correspondence with the plurality of first via holes H1, and the plurality of connecting portions 30 covers the plurality of first via holes H1 such that the first sub-portions 101 and the plurality of connecting portions 30 are electrically connected. Optionally, the plurality of second portions 20 and the plurality of connecting portions 30 are disposed in one-to-one correspondence, and the plurality of second via holes H2 covers the plurality of connecting portions 30 to electrically connect the second sub-portions 201 and the plurality of connecting portions 30, thereby implementing electrically connecting the second sub-portions 201 and the first sub-portions 101 through the plurality of connecting portions 30.

In one embodiment, the plurality of first portions 10, the plurality of connecting portions 30, and the plurality of second portions 20 are in a parallel structure, and an overall equivalent resistance is small, and a plurality of pads transmits an electrical signal to the plurality of first portions 10 through the plurality of second portions 20 and the plurality of connecting portions 30, which helps reduce a loss of the electrical signal, thereby facilitating the improvement of the signal accuracy of the plurality of first portions 10 and improving the display quality of the display panel.

In the manufacturing method provided by one embodiment, since the connecting metal layer M3 is further disposed, on the one hand, a requirement for alignment accuracy of the plurality of first via holes H1 and the plurality of second via holes H2 can be reduced, thereby reducing process difficulty and facilitating improvement of a display panel yield and reducing costs. On the other hand, the added third metal layer M3 can also be used to form signal lines or circuit structures in the display panel, which facilitates flexible routing of signal lines or circuit structures in the display panel. In a third aspect, the increased plurality of connecting portions 30 is advantageous for improving the bonding ability of the first sub-portions 101 and the second sub-portions 201, that is, a gap between the first sub-portions 101 and the second sub-portions 201 is avoided, thereby ensuring an electrical connection between the first sub-portions 101 and the second sub-portions, and reinforcing signal transmission channels of the plurality of first portions 10 and the plurality of second portions 20.

Figure 8:
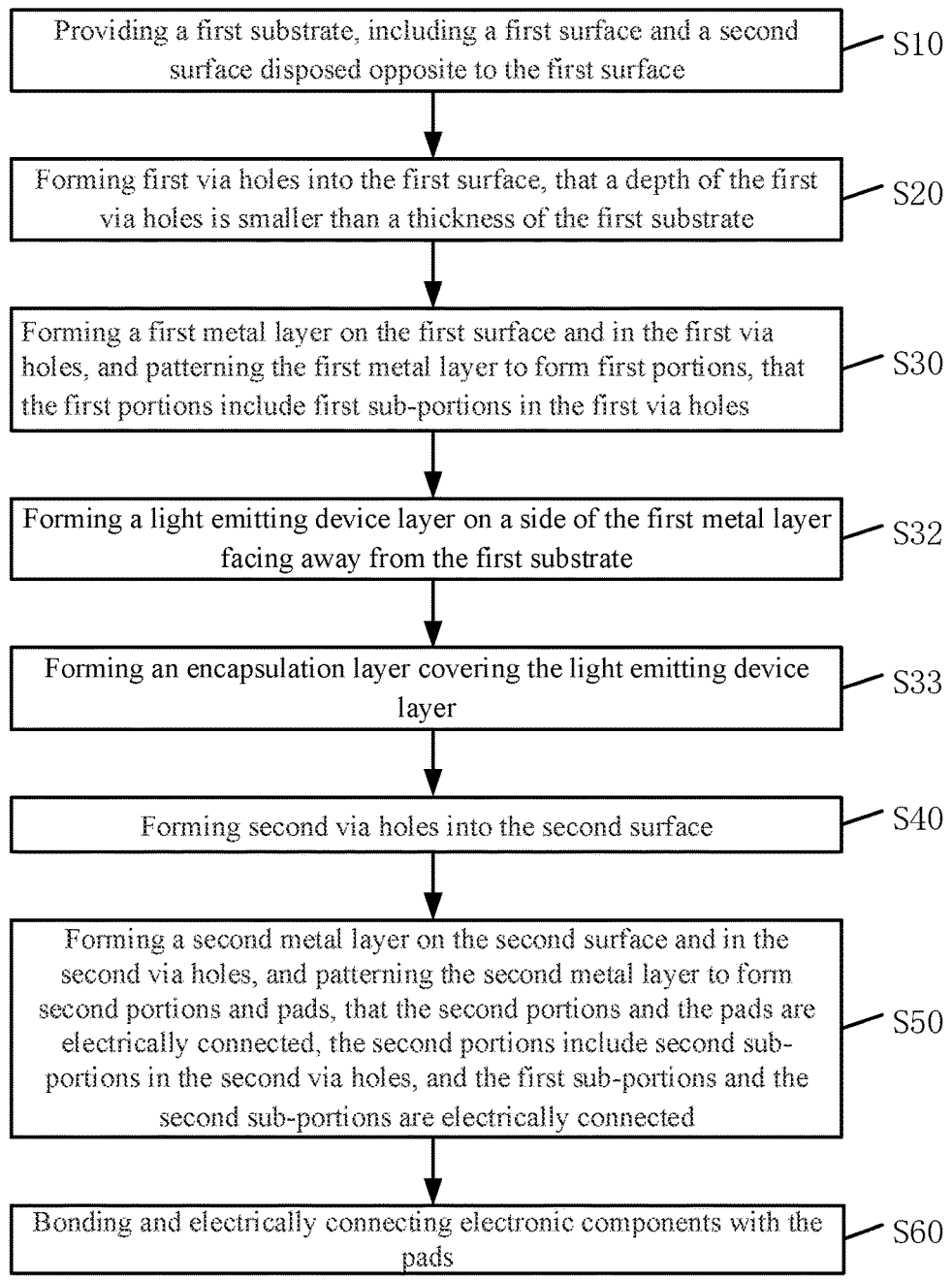
FIG. 8 is a flowchart of another manufacturing method of a display panel according to one embodiment of the present disclosure.
Figure 9:
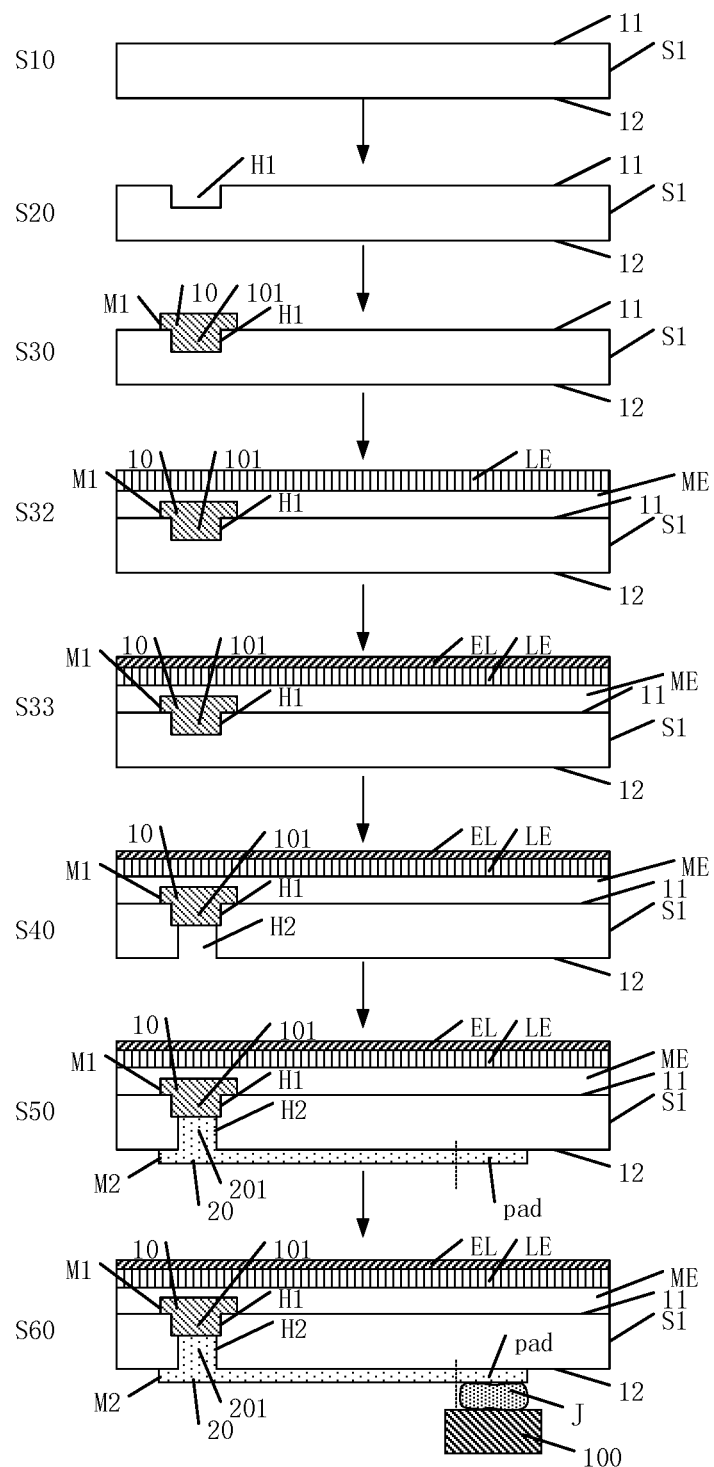
FIG. 9 is a schematic structural view of a display panel corresponding to the manufacturing method illustrated in FIG. 8.

In some alternative embodiments, referring to FIG. 8 and FIG. 9, FIG. 8 is a flowchart of another manufacturing method of a display panel according to one embodiment of the present disclosure, and FIG. 9 is a schematic structural view of a display panel corresponding to the manufacturing method shown in FIG. 8.

In one embodiment, before S40: forming a plurality of second via holes H2 into a second surface 12, the manufacturing method further includes:

S32: forming a light emitting device layer LE on a side of a first metal layer M1 facing away from a first substrate S1; and S33: forming an encapsulation layer EL covering the light emitting device layer LE.

Before S32: forming the light emitting device layer LE on the side of a first metal layer M1 facing away from the first substrate S1, the method can also include forming an insulating layer ME on a side of the first metal layer M1 facing away from the first substrate S1, such as an interlayer insulating layer, a passivation layer, etc., which may be disposed according to actual conditions and is not limited in the present disclosure.

In the manufacturing method provided by one embodiment, the first substrate is usually a flexible substrate. In a process of manufacturing the display panel, the flexible substrate needs to be disposed on a hard substrate (for example, a glass substrate), and the flexible substrate is peeled off from the hard substrate after the display panel is completed. Therefore, in the process of manufacturing the display panel provided in one embodiment, the flexible substrate is first loaded on the hard substrate, and first via holes H1, the first metal layer M1, the light emitting device layer LE, and the encapsulation layer EL are formed. After the structures on a first surface 11 side are completed, the flexible substrate is removed from the hard substrate. Then second via holes H2, second portions, pads, and the like are fabricated on a second surface 12 side. The steps are reasonable, and the flexible substrate is prevented from being flipped many times to reduce manufacturing efficiency of the display panel.

Figure 10:
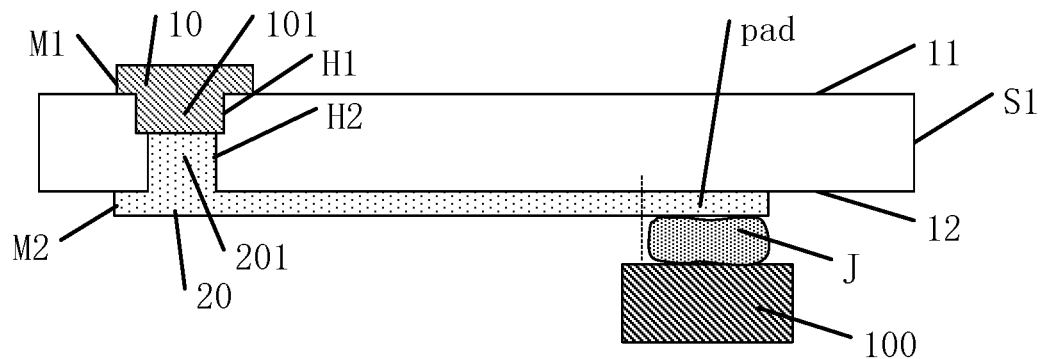
FIG. 10 is a cross-sectional structural view of a display panel according to one embodiment of the present disclosure.

The present disclosure also provides a display panel. Referring to FIG. 10, FIG. 10 is a cross-sectional structural view of a display panel according to one embodiment of the present disclosure.

The display panel provided in one embodiment includes:

a first substrate S1, that the first substrate S1 includes a first surface 11 and a second surface 12 disposed opposite to the first surface 11, the first surface 11 is provided with a plurality of first via holes H1, a depth of each of the plurality of first via holes H1 is smaller than a thickness of the first substrate S1, and the second surface 12 is provided with a plurality of second via holes H2;

a first metal layer M1, that the first metal layer M1 includes a plurality of first portions 10, the plurality of first portions 10 is located in the first surface 11, and the plurality of first portions 10 includes first sub-portions 101 in the plurality of first via holes H1;

a second metal layer M2, that the second metal layer M2 includes a plurality of second portions 20 and a plurality of pads, the plurality of second portions 20 is electrically connected to the plurality of pads, the plurality of second portions 20 is located in the second surface 12, the plurality of second portions 20 includes second sub-portions 201 in the plurality of second via holes H2, and the first sub-portions 101 and the second sub-portions 201 are electrically connected; and electronic components 100, that the electronic components 100 and the plurality of pads are bonded and electrically connected.

In the display panel provided in one embodiment, the first substrate S1 has the first surface 11 and the second surface 12 disposed opposite to the first surface. The first substrate may be a flexible substrate, for example, made of a resin material, and the material of the first substrate is not specifically limited in one embodiment.

The first substrate S1 has the plurality of first via holes H1 extending from the first surface 11 toward the second surface 12, and the plurality of second via holes H2 extending from the second surface 12 toward the first surface 11. Optionally, the plurality of second via holes H2 and the plurality of first via holes H1 are in one-to-one correspondence, and the plurality of second via holes H2 and the corresponding plurality of first via holes H1 are connected.

The first surface 11 of the first substrate S1 is provided with the first metal layer M1, and the first metal layer M1 includes the plurality of first portions 10. The second surface 12 of the first substrate S1 is provided with the second metal layer M2, and the second metal layer M2 includes the plurality of second portions 20 and the plurality of pads. The plurality of first portions 10 and the plurality of second portions 20 are electrically connected, the plurality of second portions is electrically connected to the plurality of pads, and the plurality of pads is used to bond the electronic components 100. Optionally, the electronic components 100 are bonded and electrically connected to the plurality of pads through conductive glue J. Optionally, the electronic components 100 are chips and/or flexible circuit boards.

Optionally, the display panel provided in one embodiment may further include a display unit, a driving circuit, and the like. Optionally, the structure of the display unit, the driving circuit, and the like, is formed on the first surface 11 side, but it is not specifically limited in one embodiment.

The display panel provided in one embodiment can realize transmission of electrical signals of conductive structures on opposite sides of the first substrate S1. Alternatively, the first surface 11 of the first substrate S1 is provided with the plurality of first via holes H1 and the plurality of first portions 10, and the plurality of first portions 10 includes the first sub-portions 101 in the plurality of first via holes H1. The second surface 12 of the first substrate S1 is provided with the plurality of second via holes H2 and the plurality of second portions 20. The plurality of second portions 20 includes the second sub-portions 201 in the plurality of second via holes H2. The first sub-portions 101 and the second sub-portions 201 are electrically connected, so that the plurality of first portions 10 and the plurality of second portions 20 are electrically connected, and the plurality of pads is used for bonding the electronic components 100, thereby implementing transmitting an electrical signal of the plurality of first portions 10 to the electronic components 100 through the plurality of second portions 20 and the plurality of pads. The first surface 11 side may be a front side of the display panel, that is, a side of a display screen, and the second surface 12 side may be a back side of the display panel. The electronic components 100 are bonded to the second surface 12 side of the display panel, which helps reduce the area of the non-display area and achieve the technical effect of a narrow frame. Unlike conventional bend display panel, the disclosed display panel helps improve reliability of the display panel and improve user experience. Moreover, the plurality of first portions 10 and the plurality of second portions 20 are in a parallel structure, an equivalent resistance of the plurality of first portions 10 and the plurality of second portions 20 in parallel is smaller than a resistance of the plurality of first portions 10. The plurality of pads transmits an electrical signal to the plurality of first portions 10 through the plurality of second portions 20, which is advantageous for reducing a loss of the electrical signal, thereby improving the signal accuracy of the plurality of first portions 10 and improving the display quality of the display panel.

Figure 11:
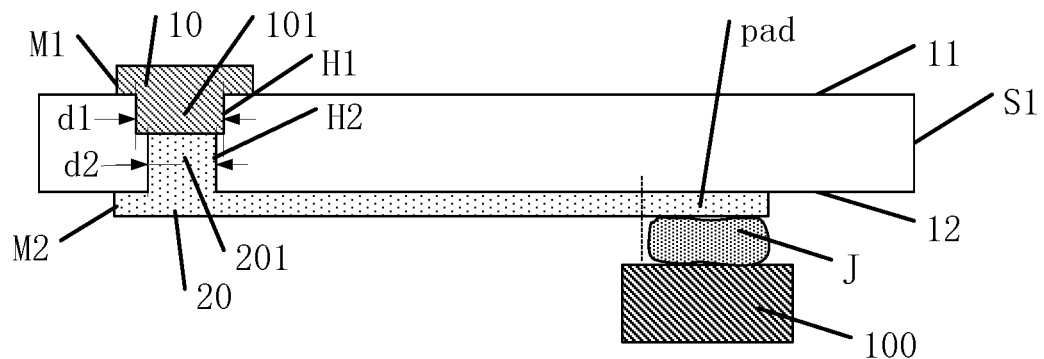
FIG. 11 is a cross-sectional structural view of another display panel according to one embodiment of the present disclosure.

In some alternative embodiments, referring to FIG. 11, FIG. 11 is a cross-sectional structural view of another display panel according to one embodiment of the present disclosure.

In one embodiment, a diameter d1 of each of a plurality of first via holes H1 is larger than a diameter d2 of each of a plurality of second via holes H2.

In the display panel provided in one embodiment, the plurality of first via holes H1 is formed first, and then the plurality of second via holes H2 is formed. Setting the diameter d1 of each of the plurality of first via holes H1 to be larger than the diameter d2 of each of the plurality of second via holes H2 can reduce a requirement for alignment accuracy of the plurality of first via holes H1 and the plurality of second via holes H2, thereby reducing manufacturing difficulty of the display panel, and improving the yield of the display panel.

Figure 12:
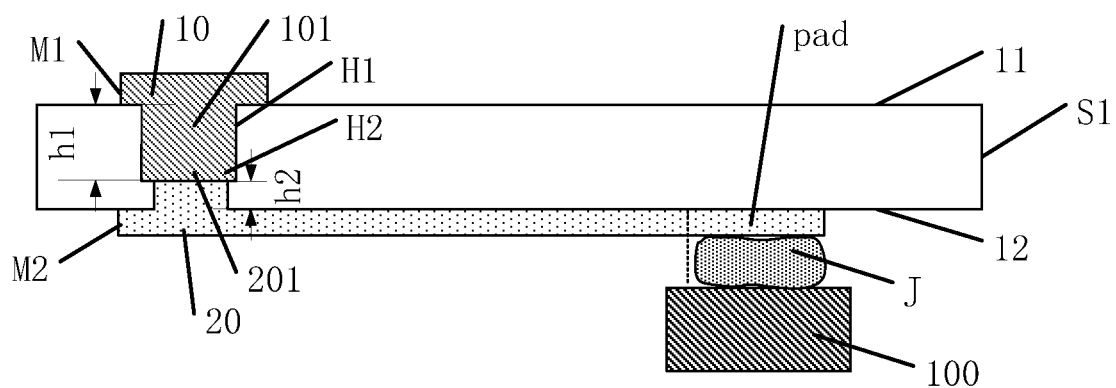
FIG. 12 is a cross-sectional structural view of another display panel according to one embodiment of the present disclosure.

In some alternative embodiments, referring to FIG. 12, FIG. 12 is a cross-sectional structural view of another display panel according to one embodiment of the present disclosure.

In one embodiment, a depth h1 of each of a plurality of first via holes H1 is greater than a depth h2 of each of a plurality of second via holes H2.

In the display panel provided in one embodiment, the plurality of first via holes H1 is formed first, and then the plurality of second via holes H2 is formed. When the plurality of first via holes H1 is formed, structures in the display panel are less, so that the plurality of first via holes H1 with a greater depth can be formed. When the plurality of second via holes H2 is formed, a display unit, a driving circuit, and an encapsulation structure of the display panel have been completed, and structures in the display panel are more. To avoid influence of a punching process on reliability of the structures in the display panel, it is not appropriate to perform a relatively complicated punching process in the display panel. Therefore, the depth h2 of each of the plurality of second via holes H2 is set to be smaller, so that the plurality of second via holes H2 is easily fabricated, which is advantageous for ensuring reliability of the display panel.

Figure 13:
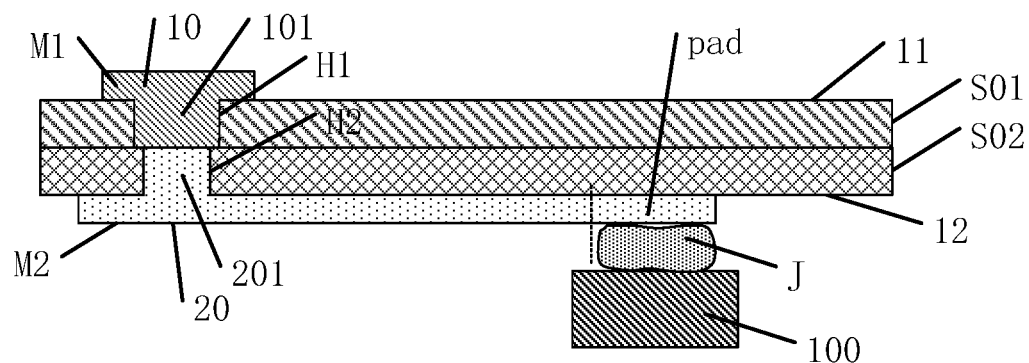
FIG. 13 is a cross-sectional structural view of another display panel according to one embodiment of the present disclosure.

In some alternative embodiments, referring to FIG. 13, FIG. 13 is a cross-sectional structural view of another display panel according to one embodiment of the present disclosure.

In one embodiment, a first substrate S1 includes a first sub-board S01 and a second sub-board S02 stacking over the first sub-board S01.

A side surface of the first sub-board S01 facing away from the second sub-board S02 is a first surface 11, and a side surface of the second sub-board S02 facing away from the first sub-board S01 is a second surface 12.

A plurality of first via holes H1 passes through the first sub-board S01, and a plurality of second via holes H2 passes through the second sub-board S02.

In one embodiment, the first substrate S1 has a two-layer structure, and includes the first sub-board S01 and the second sub-board S02 stacked over. The plurality of first via holes H1 passes through the first sub-board S01, and the plurality of second via holes H2 passes through the second sub-board S02. The plurality of first via holes H1 and the plurality of second via holes H2 may be directly connected, so that first sub-portions 101 and second sub-portions 201 are in direct contact to achieve an electrical connection.

Figure 14:
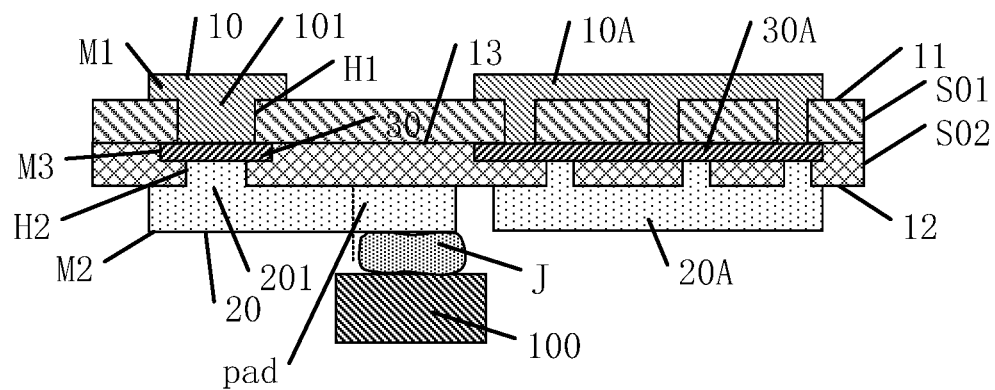
FIG. 14 is a cross-sectional structural view of another display panel according to one embodiment of the present disclosure.

In some alternative embodiments, referring to FIG. 14, FIG. 14 is a cross-sectional structural view of another display panel according to one embodiment of the present disclosure.

In one embodiment, a side surface of a first sub-board S01 adjacent to a second sub-board S02 is a third surface 13, and the third surface 13 is provided with a connecting metal layer M3.

The connecting metal layer M3 includes a plurality of connecting portions 30, the plurality of connecting portions 30 covers a plurality of first through holes H1, and first sub-portions 101 and the plurality of connecting portions 30 are electrically connected.

A plurality of second via holes H2 is electrically connected to the plurality of connecting portions 30, and second sub-portions 201 are electrically connected to the first sub-portions 101 through the plurality of connecting portions 30.

In one embodiment, the connecting metal layer M3 is further disposed between a first sub-boards S01 and a second sub-boards S02, and the connecting metal layer M3 includes the plurality of connecting portions 30. Optionally, the plurality of connecting portions 30 and the plurality of first via holes H1 are disposed in one-to-one correspondence, and the plurality of connecting portions 30 covers the plurality of first via holes H1 such that the first sub-portions 101 and the plurality of connecting portion 30 are electrically connected. Optionally, the plurality of second portions 20 and the plurality of connecting portions 30 are disposed in one-to-one correspondence, and the plurality of second via holes H2 covers the plurality of connecting portions 30 to electrically connect the second sub-portions 201 with the plurality of connecting portions 30, thereby implementing electrically connecting the second sub-portions 201 to the first sub-portions 101 through the plurality of connecting portions 30.

In one embodiment, the plurality of first portions 10, the plurality of connecting portions 30, and the plurality of second portions 20 are in a parallel structure, and an overall equivalent resistance is small, and a plurality of pads transmits an electrical signal to the plurality of first portions 10 through the plurality of second portions 20 and the plurality of connecting portions 30, which helps reduce a loss of the electrical signal, thereby facilitating improvement of signal accuracy of the plurality of first portions 10 and improving the display quality of the display panel.

Optionally, a first metal layer M1 includes first portions 10A, a second metal layer M2 includes second portions 20A, and a connecting metal layer M3 includes connecting portions 30A. The first portions 10A can be electrically connected to the connecting portions 30A through a plurality of first via holes H1, and the second portions 20A can be electrically connected to the connecting portions 30A through a plurality of second via holes H2. The first portions 10A can be a part of signal lines in the display panel. The first portions 10A, the connecting portions 30A, and the second portions 20A are integrally connected in parallel, and an equivalent resistance is smaller than a resistance of the first portions 10A, which is advantageous for reducing a loss of an electrical signal of the first portions 10A.

Optionally, the connecting portions 30A may be disposed in one-to-one correspondence with the plurality of first via holes H1, or two or more of the plurality of first via holes H1 may be correspondingly disposed in one connecting portion 30A. The shape and size of the connecting portions 30A are not specifically limited in one embodiment.

In one embodiment, since the connecting metal layer M3 is further disposed, on the one hand, a requirement of alignment accuracy of the plurality of first via holes H1 and the plurality of second via holes H2 can be reduced, thereby reducing process difficulty, improving the yield of the display panel, and reducing costs. On the other hand, the added third connecting metal layer M3 can also be used to form signal lines or circuit structures in the display panel, which facilitates flexible routing of signal lines or circuit structures in the display panel.

Figure 15:
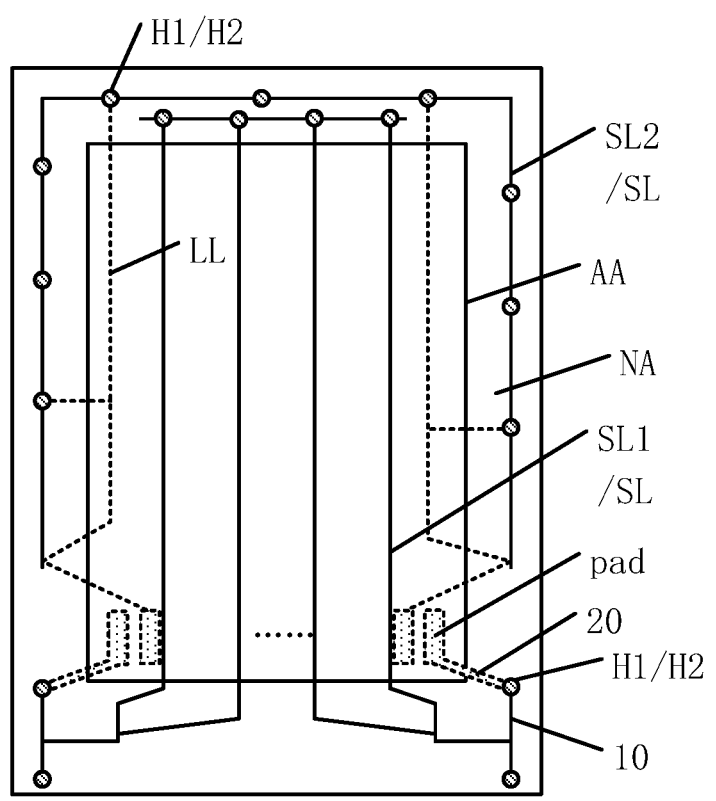
FIG. 15 is a plane structure view showing another display panel according to one embodiment of the present disclosure.

In some alternative embodiments, referring to FIG. 15, FIG. 15 is a plane structure view of another display panel according to one embodiment of the present disclosure.

In one embodiment, the display panel includes a plurality of signal lines SL1. The plurality of signal lines SL1 is located on a first surface 11 facing away from a second surface 12, and the plurality of signal lines SL1 and first portions 10 are electrically connected.

To clearly illustrate the technical solution of one embodiment, in FIG. 15, structures belonging to a first metal layer M1 are indicated by solid lines, and structures belonging to a second metal layer M2 are indicated by dash lines.

In the display panel provided in one embodiment, the number of signal lines SL in the display panel is large. For example, the signal lines SL may be at least one of data lines, Power VDD (PVDD) signal lines, and Power VEE (PVEE) signal lines. Optionally, pixels (not shown) are disposed in the display panel, and the pixels include a pixel driving circuit, and the PVDD signal lines and the PVEE signal lines can provide a driving signal for the pixel driving circuit. The signal lines SL can also be routings in other circuit structures in the display panel, such as gate lines, which is not specifically limited in one embodiment. The signal lines SL may be located in a display area AA or in a non-display area NA. Alternatively, the signal lines SL may be partially located in the display area AA and partially in the non-display area NA, which is not specifically limited in one embodiment.

The display panel provided in one embodiment can electrically connect the signal lines SL on the first surface 11 side to pads on the second surface 12 side through first portions 10 and second portions 20, which is beneficial to a narrow frame of the display panel. Optionally, the signal lines SL and the first portions 10 may be an integrally formed structure. Optionally, the first portions 10 may be partial lines of the signal lines SL.

Figure 16:
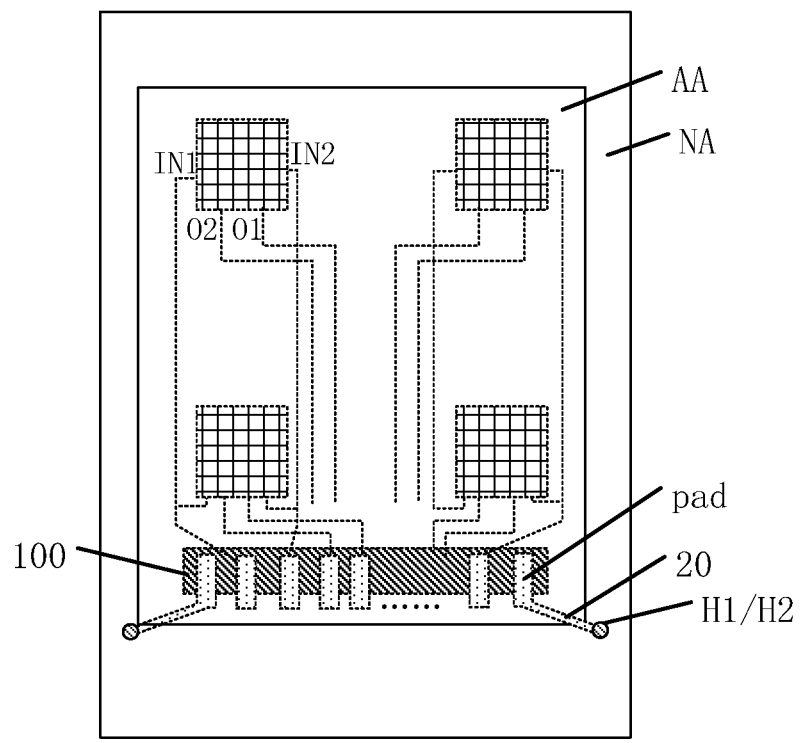
FIG. 16 is a plane structure view showing another display panel according to one embodiment of the present disclosure.
Figure 17:
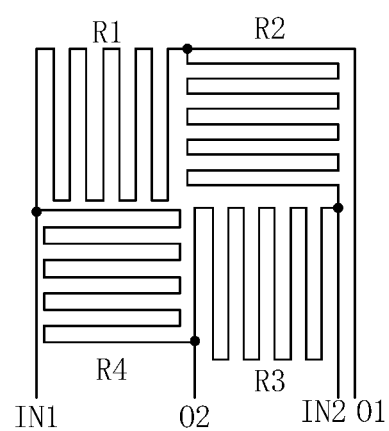
FIG. 17 is a schematic structural view of a pressure sensor in the display panel shown in FIG. 16.

In some alternative embodiments, referring to FIG. 16 and FIG. 17, FIG. 16 is a plane structure view of another display panel according to one embodiment of the present disclosure, and FIG. 17 is a schematic view of a pressure sensor in the display panel shown in FIG. 16.

In one embodiment, a second metal layer M2 includes: a plurality of pressure sensors PS.

Each of the plurality of pressure sensors PS is a Wheatstone bridge structure, including: a first sensing resistor R1, a second sensing resistor R2, a third sensing resistor R3, and a fourth sensing resistor R4.

A first end of the first sensing resistor R1 and a first end of the fourth sensing resistor R4 are electrically connected to a first power input end IN1, a second end of the first sensing resistor R1 and a first end of the second sensing resistor R2 are electrically connected to a first sensing signal measuring end O1, a second end of the fourth sensing resistor R4 and a first end of the third sensing resistor R3 are electrically connected to a second sensing signal measuring end O2, and a second end of the second sensing resistor R2 and a second end of the third sensing resistor R3 are electrically connected to a second power input end IN2.

In the display panel provided in one embodiment, the plurality of pressure sensors PS are formed using the second metal layer M2, and the plurality of pressure sensors PS is used to sense whether the display panel is subjected to a pressure. Alternatively, the plurality of pressure sensors PS can sense a magnitude of the pressure. Optionally, the first sensing resistor R1, the second sensing resistor R2, the third sensing resistor R3, and the fourth sensing resistor R4 are each a fold line structure, which ensures that each sensing resistor occupies a small area while increasing contact area of the resistor and the substrate, to improve accuracy of pressure sensing.

Since the plurality of pressure sensors PS is disposed on a non-display surface side of the display panel, the plurality of pressure sensors PS does not affect transmittance of the display panel, a position setting of the plurality of pressure sensors PS is flexible, and the plurality of pressure sensors PS can be set in a display area AA, or in a non-display area NA.

Optionally, the first power input end IN1, the first sensing signal measuring end O1, the second sensing signal measuring end O2, and the second power input end IN2 are electrically connected to electronic components 100 through pads. The electronic components 100 are used to transmit an electrical signal to the plurality of pressure sensors PS.

Figure 18:
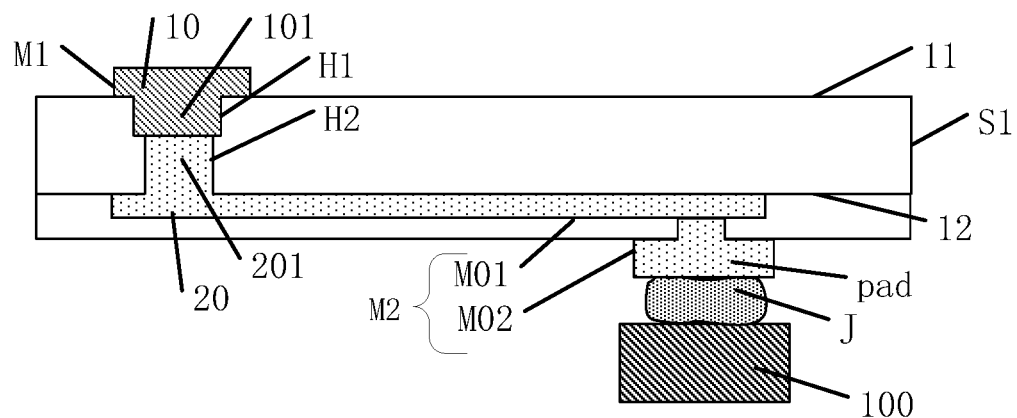
FIG. 18 is a cross-sectional structural view of another display panel according to one embodiment of the present disclosure.

In some alternative embodiments, referring to FIG. 18, FIG. 18 is a cross-sectional structural view of another display panel according to one embodiment of the present disclosure.

In one embodiment, a second metal layer M2 includes a first sub-metal layer M01 and a second sub-metal layer M02. The first sub-metal layer M01 and the second sub-metal layer M02 are electrically connected.

In the display panel provided in one embodiment, when a relatively complicated structure needs to be disposed in the second metal layer M2, the second metal layer M2 may be configured as a double layer structure, thereby facilitating arrangements of wirings, enriching functions of the display panel, and keeping layouts more flexible. For example, optionally, the first sub-metal layer M01 is provided with wirings, and the second sub-metal layer M02 is provided with pads, but it is not specifically limited in one embodiment.

Figure 19:
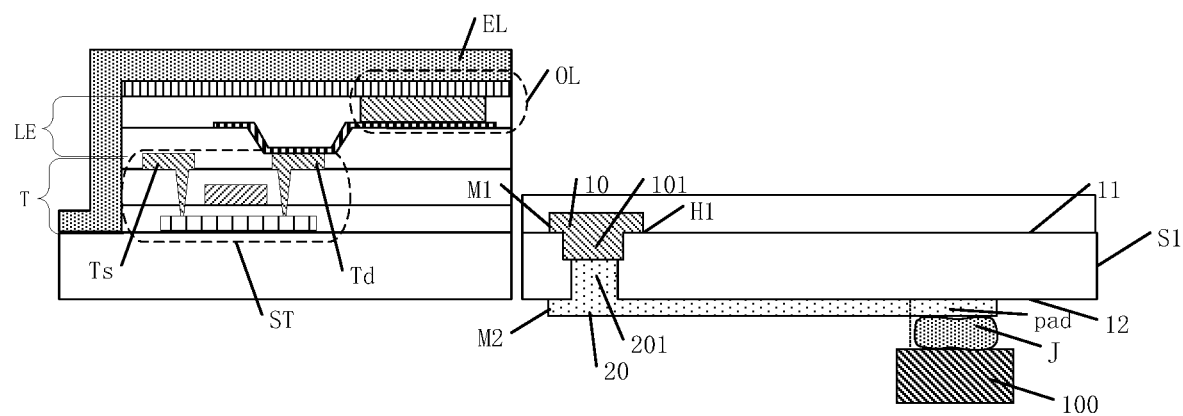
FIG. 19 is a cross-sectional structural view of another display panel according to one embodiment of the present disclosure.

In some alternative embodiments, referring to FIG. 19, FIG. 19 is a cross-sectional structural view of another display panel according to one embodiment of the present disclosure.

The display panel includes a light emitting device layer LE located on a side of a first metal layer M1 facing away from a first substrate S1, and an encapsulation layer EL covering the light emitting device layer LE.

In the display panel provided in one embodiment, the light emitting device layer LE and the encapsulation layer EL are located on the side of the first metal layer M1 facing away from the first substrate S1. Optionally, the light emitting device layer LE includes Light Emitting Diodes (LEDS) OL. Optionally, the encapsulation layer EL is a thin film encapsulation layer.

Optionally, the display panel further includes a driving device layer T. The driving device layer T includes a transistor switch ST, and the transistor switch ST can be electrically connected to the LEDS OL for driving the LEDS OL to emit light. Optionally, first portions 10 are located in a same film layer as a source Ts and a drain Td of the transistor switch ST.

The present disclosure also provides a display device including the display panel provided by any of the above embodiments of the present disclosure.

Figure 20:
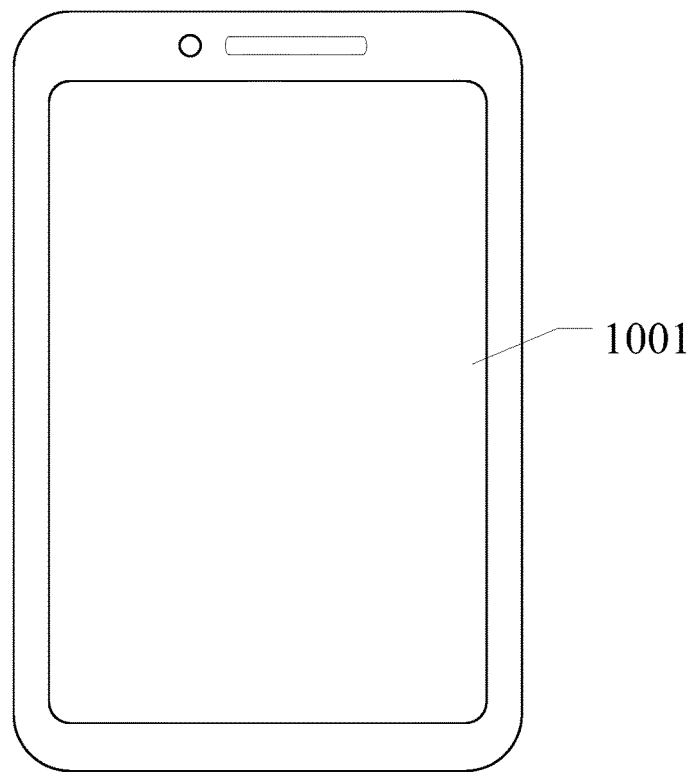
FIG. 20 is a schematic structural view of a display device according to one embodiment of the present disclosure.

Referring to FIG. 20, FIG. 20 is a schematic structural view of a display device according to one embodiment of the present disclosure. A display device 1000 provided in FIG. 20 includes a display panel 1001 provided by any of the above embodiments of the present disclosure.

The display device 1000 is described by using a mobile phone as an example. The display device provided by one embodiment of the present disclosure may be a display device having a display function, such as a computer, a television, an in-vehicle display device, and the like. It is not specifically limited in the present disclosure. The display device provided by one embodiment of the present disclosure has the beneficial effects of the display panel provided by the embodiments of the present disclosure. Details can be referred to the detailed description of the display panel in the foregoing embodiments, and are not described herein again.

From the above embodiments, the display panel, the manufacturing method thereof, and the display device provided by the present disclosure achieve at least the following beneficial effects.

The display panel produced by the manufacturing method provided in present disclosure can realize transmission of electrical signals of conductive structures on opposite sides of a first substrate. Optionally, a plurality of first via holes is formed into a first surface of the first substrate, then a plurality of first portions is formed, and the plurality of first portions includes first sub-portions in the plurality of first via holes. A plurality of second via holes is formed into a second surface of the first substrate, then a plurality of second portions and a plurality of pads are formed, and the plurality of second portions includes second sub-portions in the plurality of second via holes. The first sub-portions and the second sub-portions are electrically connected, that is, the plurality of first portions and the plurality of second portions are electrically connected, the plurality of pads and the plurality of second portions are electrically connected, and the plurality of pads is used for bonding electronic components. Thereby, an electrical signal of the plurality of first portions is transmitted to the electronic components through the plurality of second portions and the plurality of pads. A first surface side may be a front side of the display panel, that is, a side of a display screen, and a second surface side may be a back side of the display panel. The electronic components are bonded to the second surface side of the display panel, which helps reduce an area of a non-display area and achieve technical effect of a narrow frame. Unlike conventional bent display panels, the disclosed display panel is beneficial to improving reliability of the display panel and improving user experience. Moreover, the plurality of first portions and the plurality of second portions are in a parallel structure, and an equivalent resistance of the plurality of first portions and the plurality of second portions in parallel is smaller than a resistance of the plurality of first portions. The plurality of pads transmits an electrical signal to the plurality of first portions through the plurality of second portions, which helps reduce a loss of the electrical signal, thereby improving signal accuracy of the plurality of first portions and improving the display quality of the display panel.

Any product embodying the present disclosure does not necessarily have to specifically meet all of the technical effects described above.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. The scope of the present disclosure is defined by the appended claims.

What is claimed is:

1. A display panel, comprising:
a first substrate, wherein the first substrate includes a first surface and a second surface disposed opposite to the first surface, wherein:
the first surface is provided with a plurality of first via holes, and a depth of each of the plurality of first via holes is smaller than a thickness of the first substrate; and
the second surface is provided with a plurality of second via holes;
a first metal layer, wherein the first metal layer includes a plurality of first portions, the plurality of first portions is located in the first surface, and the plurality of first portions includes first sub-portions in the plurality of first via holes;
a second metal layer, wherein the second metal layer includes a plurality of second portions and a plurality of pads, the plurality of second portions and the plurality of pads are electrically connected, the plurality of second portions is located in the second surface, the plurality of second portions includes second sub-portions in the plurality of second via holes, and the first sub-portions and the second sub-portions are electrically connected;
a connecting metal layer including a plurality of connecting portions, wherein a diameter of each of plurality of connecting portions is larger than a diameter of a corresponding first via hole of the plurality of first via holes and a diameter of a corresponding second via hole of the plurality of second via holes; and
electronic components, wherein the electronic components and the plurality of pads are bonded and electrically connected.

2. The display panel according to claim 1, wherein:
an orthographic projection of each of the plurality of first via holes on the first surface at least partially overlaps an orthographic projection of each of the plurality of second via holes on the first surface.

3. The display panel according to claim 1, wherein:
the diameter of the corresponding first via hole of the plurality of first via holes is larger than the diameter of the corresponding second via hole of the plurality of second via holes.

4. The display panel according to claim 1, wherein:
the second metal layer includes a first sub-metal layer and a second sub-metal layer, and the first sub-metal layer and the second sub-metal layer are electrically connected.

5. The display panel according to claim 1, further comprising:
a light emitting device layer on a side of the first metal layer facing away from the first substrate; and
an encapsulation layer covering the light emitting device layer.

6. The display panel according to claim 1, wherein:
a depth of each of the plurality of first via holes is greater than a depth of each of the plurality of second via holes.

7. The display panel according to claim 1, wherein:
the electronic components are chips and/or flexible circuit boards.

8. The display panel according to claim 1, wherein:
a material of the first substrate includes a resin material.

9. The display panel according to claim 1, wherein:
the first substrate includes a first sub-board and a second sub-board stacking over the first sub-board;
a side surface of the first sub-board facing away from the second sub-board is the first surface, and a side surface of the second sub-board facing away from the first sub-board is the second surface; and
the plurality of first via holes passes through the first sub-board, and the plurality of second via holes passes through the second sub-board.

10. The display panel according to claim 9, wherein:
a side surface of the first sub-board adjacent to the second sub-board is a third surface, and the third surface is provided with the connecting metal layer;
the plurality of connecting portions covers the plurality of first via holes, and the first sub portions and the plurality of connecting portions are electrically connected; and
the plurality of second via holes is electrically connected to the plurality of connecting portions, and the second sub-portions are electrically connected to the first sub-portions through the plurality of connecting portions.

11. The display panel according to claim 1, further comprising:
a plurality of signal lines, wherein the plurality of signal lines is located on the first surface facing away from the second surface, and the plurality of signal lines is electrically connected to the plurality of first portions.

12. The display panel according to claim 11, wherein:
the plurality of signal lines includes: data lines, Power VDD (PVDD) signal lines, and Power VEE (PVEE) signal lines.

13. A display panel comprising:
a first substrate, wherein the first substrate includes a first surface and a second surface disposed opposite to the first surface, wherein:
the first surface is provided with a plurality of first via holes, and a depth of each of the plurality of first via holes is smaller than a thickness of the first substrate; and
the second surface is provided with a plurality of second via holes;
a first metal layer, wherein the first metal layer includes a plurality of first portions, the plurality of first portions is located in the first surface, and the plurality of first portions includes first sub-portions in the plurality of first via holes;
a second metal layer, wherein the second metal layer includes a plurality of second portions and a plurality of pads, the plurality of second portions and the plurality of pads are electrically connected, the plurality of second portions is located in the second surface, the plurality of second portions includes second sub-portions in the plurality of second via holes, and the first sub-portions and the second sub-portions are electrically connected; and
electronic components, wherein the electronic components and the plurality of pads are bonded and electrically connected, wherein:
the second metal layer includes a plurality of pressure sensors:
each of the plurality of pressure sensors is a Wheatstone bridge structure, including: a first sensing resistor, a second sensing resistor, a third sensing resistor, and a fourth sensing resistor; and
a first end of the first sensing resistor and a first end of the fourth sensing resistor are electrically connected to a first power input end, a second end of the first sensing resistor and a first end of the second sensing resistor are electrically connected to a first sensing signal measuring end, a second end of the fourth sensing resistor and a first end of the third sensing resistor are electrically connected to a second sensing signal measuring end, and a second end of the second sensing resistor and a second end of the third sensing resistor are electrically connected to a second power input end.

14. The display panel according to claim 13, wherein:
the first power input end, the first sensing signal measuring end, the second sensing signal measuring end, and the second power input end, are electrically connected to the electronic components.

15. The display panel according to claim 13, wherein:
an orthographic projection of each of the plurality of first via holes on the first surface at least partially overlaps an orthographic projection of each of the plurality of second via holes on the first surface.

16. The display panel according to claim 13, wherein:
a diameter of each of the plurality of first via holes is larger than a diameter of each of the plurality of second via holes.

17. The display panel according to claim 13, wherein:
a depth of each of the plurality of first via holes is greater than a depth of each of the plurality of second via holes.

18. The display panel according to claim 13, wherein:
the first substrate includes a first sub-board and a second sub-board stacking over the first sub-board;
a side surface of the first sub-board facing away from the second sub-board is the first surface, and a side surface of the second sub-board facing away from the first sub-board is the second surface; and
the plurality of first via holes passes through the first sub-board, and the plurality of second via holes passes through the second sub-hoard.

19. The display panel according to claim 18, wherein:
a side surface of the first sub-board adjacent to the second sub-board is a third surface, and the third surface is provided with a connecting metal layer;
the connecting metal layer includes a plurality of connecting portions, the plurality of connecting portions covers the plurality of first via holes, and the first sub portions and the plurality of connecting portions are electrically connected; and
the plurality of second via holes is electrically connected to the plurality of connecting portions, and the second sub-portions are electrically connected to the first sub-portions through the plurality of connecting portions.

20. A display device, comprising:
a display panel, including:
- a first substrate, wherein the first substrate includes a first surface and a second surface disposed opposite to the first surface, wherein:
  - the first surface is provided with a plurality of first via holes, and a depth of each of the plurality of first via holes is smaller than a thickness of the first substrate; and
  - the second surface is provided with a plurality of second via holes;
- a first metal layer, wherein the first metal layer includes a plurality of first portions located in the first surface including first sub-portions in the plurality of first via holes;
- a second metal layer, wherein the second metal layer includes a plurality of second portions and a plurality of pads electrically connected with the plurality of second portions, the plurality of second portions is located in the second surface and includes second sub-portions in the plurality of second via holes, and the first sub-portions and the second sub-portions are electrically connected;
- a connecting metal layer including a plurality of connecting portions, wherein a diameter of each of plurality of connecting portions is larger than a diameter of a corresponding first via hole of the plurality of first via holes and a diameter of a corresponding second via hole of the plurality of second via holes; and
- electronic components electrically connected and bonded with the plurality of pads.

* * * * *